(12) United States Patent
Maruyama et al.

(10) Patent No.: US 7,785,414 B2
(45) Date of Patent: Aug. 31, 2010

(54) PROCESS FOR MANUFACTURING WAFER OF SILICON CARBIDE SINGLE CRYSTAL

(75) Inventors: Takayuki Maruyama, Kodaira (JP); Toshimi Chiba, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 513 days.

(21) Appl. No.: 11/597,568

(22) PCT Filed: May 25, 2005

(86) PCT No.: PCT/JP2005/009568

§ 371 (c)(1),
(2), (4) Date: Nov. 27, 2006

(87) PCT Pub. No.: WO2005/116307

PCT Pub. Date: Dec. 8, 2005

(65) Prior Publication Data

US 2008/0032880 A1 Feb. 7, 2008

(30) Foreign Application Priority Data

May 27, 2004 (JP) .............................. 2004-158113
Nov. 22, 2004 (JP) .............................. 2004-338058

(51) Int. Cl.
*C30B 23/00* (2006.01)
*C30B 28/12* (2006.01)

(52) U.S. Cl. .................... 117/84; 117/81; 117/82; 117/83; 117/85; 117/86; 117/87

(58) Field of Classification Search .............. 117/81–87
See application file for complete search history.

(56) References Cited

U.S. PATENT DOCUMENTS

| | | | |
|---|---|---|---|
| 4,912,064 A | 3/1990 | Kong et al. | |
| 5,011,549 A * | 4/1991 | Kong et al. | 148/33.1 |
| 5,248,385 A | 9/1993 | Powell | |
| 5,501,173 A * | 3/1996 | Burk et al. | 117/84 |
| 7,387,679 B2 * | 6/2008 | Maruyama et al. | 117/107 |
| 7,531,433 B2 * | 5/2009 | Ellison et al. | 438/478 |
| 7,553,373 B2 * | 6/2009 | Otsuki et al. | 117/109 |

(Continued)

FOREIGN PATENT DOCUMENTS

EP 0 612 104 A2 8/1994

(Continued)

OTHER PUBLICATIONS

English Machine Translation of JP2003-282451.*

(Continued)

*Primary Examiner*—G. Nagesh Rao
(74) *Attorney, Agent, or Firm*—Sughrue Mion, PLLC

(57) ABSTRACT

A process for manufacturing a wafer of a silicon carbide single crystal having: cutting a wafer from an α (hexagonal)-silicon carbide single crystal so that the off-angle is totally in the range from 0.4 to 2° to a plane obtained in perpendicular to the [0001]c axis of the silicon carbide single crystal; disposing the wafer in a reaction vessel; feeding a silicon source gas and carbon source gas in the reaction vessel; and epitaxially growing the α (hexagonal) silicon carbide single crystal on the wafer by allowing the silicon source gas and carbon source gas to react.

5 Claims, 16 Drawing Sheets

U.S. PATENT DOCUMENTS

| | | | |
|---|---|---|---|
| 2002/0096104 A1* | 7/2002 | Yagi et al. | 117/84 |
| 2004/0134418 A1* | 7/2004 | Hirooka | 117/101 |
| 2005/0059247 A1* | 3/2005 | Ikenaka | 438/692 |
| 2006/0011128 A1* | 1/2006 | Ellison et al. | 117/84 |
| 2008/0032880 A1* | 2/2008 | Maruyama et al. | 501/88 |
| 2008/0213536 A1* | 9/2008 | Maruyama et al. | 428/141 |

FOREIGN PATENT DOCUMENTS

| | | |
|---|---|---|
| EP | 0 962 963 A1 | 12/1999 |
| EP | 1 657 740 A1 | 5/2006 |
| JP | 2003-282451 A | 10/2003 |
| JP | 2005-64383 A | 3/2005 |
| JP | 2005-109408 A | 4/2005 |

OTHER PUBLICATIONS

Supplementary European Search Report dated Apr. 6, 2009.

"Vapour Phase Growth of Epitaxial Silicon Carbide Layers", Wagner et al., vol. 47, No. 2-3, 2003, pp. 139-165, Jan. 1, 2003.

"Step-Controlled Epitaxial Growth of SiC: High Quality Homoepitaxy", Matsunami et al., vol. 20, No. 3, 1997, pp. 125-166, Aug. 1, 1997.

"Growth Mechanism of 6H-SiC in Step-Controlled Epitaxy", Kimoto et al., pp. 726-732, Jan. 15, 2007.

"Homoepitaxial Growth of 4H-SiC on On-Axis (0 0 0 1) C-face Substrates by Chemical Vapor Deposition", Kojima et al., vol. 269, No. 2-4, 2004, pp. 367-376, Sep. 1, 2004.

"Homoepitaxy of 6H-SiC on Nearly On-Axis (0 0 0 1) faces by Chemical Vapor Deposition Part I: Effect of C/Si Ratio on Wide-Area Homoepitaxy Without 3C-SiC Inclusions", Nakamura et al., vol. 256, No. 3-4, 2003, pp. 341-346, Sep. 1, 2003.

"Surface Roughness Studies on 4H-SiC Layers Grown by Liquid Phase Epitaxy", Kuznetsov N. et al., vol. 80, No. 1-3, 2001, pp. 345-347, Mar. 22, 2004.

* cited by examiner

15mm

3mm

200μm

200μm

200μm

PROCESS FOR MANUFACTURING WAFER OF SILICON CARBIDE SINGLE CRYSTAL

CROSS-REFERENCE TO RELATED APPLICATIONS

This application, Ser. No. 11/597,568 is a 371 of PCT/JP05/09568 filed May 25, 2005 with a benefit claim of priority towards JP 2004-158113 filed May 27, 2004 and JP 2004-338058 filed Nov. 22, 2004.

TECHNICAL FIELD

The invention relates to a wafer of a silicon carbide single crystal particularly suitable for electronic devices and optical devices, and a process capable of efficiently manufacturing the wafer of the silicon carbide single crystal.

BACKGROUND ART

Silicon carbide has been noticed as materials of electronic devices such as small size and high output power semiconductors since silicon carbide has a larger band gap than silicon and is excellent in dielectric breakdown strength, heat resistance and radiation resistance, and as materials of optical devices since silicon carbide is excellent in joinability with other compound semiconductors excellent in optical characteristics. The silicon carbide single crystal is advantageous over the polycrystal of silicon carbide in that it is excellent in uniformity of intra-wafer characteristics when applied to devices such as wafers.

The wafer should be epitaxially grown as a thin film when luminescent devices and electronic devices are manufactured using the wafer of the silicon carbide single crystal. For example, silicon carbide is grown by a CVD process at a temperature range as high as from 1700 to 1800° C. or higher for allowing $\alpha$-silicon carbide to epitaxially grow on (0001)c plane of $\alpha$-silicon carbide single crystal. This is because planarity of the grown surface is remarkably impaired due to generation of triangular-pit defects when silicon carbide is grown at a temperature lower than 1700° C. However, exhaustion of members such as susceptors for holding the wafer is vigorous when silicon carbide is grown at a temperature range from 1700 to 1800° C. or higher, and electrical characteristics of the epitaxially grown film tend to be deteriorated due to impurities generated from the exhausted member.

Epitaxial growth without any dislocations is possible even at a temperature range from 1500 to 1600° C. by using a wafer having a so-called off-angle that is inclined several degrees to the (0001)c plane of the wafer. However, utilization rate of the bulk single crystal is remarkably decreased when the off-angle is large, and this problem is significant as the aperture size is larger. For example, when the wafer is manufactured by providing an off-angle of 3.5° that is common in silicon carbide wafer with crystal polymorph of 6H from a bulk single crystal grown in the [0001]c axis direction and having a crystal diameter of 50 mm and a crystal height of 20 mm, the utilization ratio of the bulk crystal is 84% and 16% of the crystal remains unused. The utilization ratio further decreases to 69% when the crystal diameter is expanded to 100 mm, and this decrease is not preferable since the price of the wafer increases. Since the dislocation density on the c-plane as a growth surface increases when the off-angle is large, characteristics of the element may be deteriorated. Furthermore, separation of the manufactured element by cleavage is difficult when the off-angle is large. This problem is crucial in the optical device that utilizes the cleavage surface itself of a laser diode.

While several technologies have been proposed as means for solving the above-mentioned problem, there is some room for improving the utilization rate of the bulk silicon carbide single crystal and for improving the characteristics of the element (for example, see Patent Document 1).

Patent Document 1: U.S. Pat. No. 4,912,064

PROBLEMS TO BE SOLVED BY THE INVENTION

Accordingly, there have been needs for a process for manufacturing a wafer of a silicon carbide single crystal that is able to improve the utilization rate of a bulk silicon carbide single crystal, to improve characteristics of the element and to improve cleavability, and a wafer of a silicon carbide single crystal obtained by the above-mentioned process.

MEANS FOR SOLVING THE PROBLEM (1) A process for manufacturing a wafer of a silicon carbide single crystal having:

cutting a wafer from an $\alpha$ (hexagonal)-silicon carbide single crystal so that the off-angle is totally in the range from 0.4 to 2° to a plane obtained in perpendicular to the [0001]c axis of the silicon carbide single crystal;

disposing the wafer in a reaction vessel;

feeding a silicon source gas and carbon source gas in the reaction vessel; and epitaxially growing the $\alpha$ (hexagonal) silicon carbide single crystal on the wafer by allowing the silicon source gas and carbon source gas to react.

(2) The process for manufacturing the wafer of the silicon carbide single crystal according to (1), wherein the off-angle of the wafer cut from the silicon carbide single crystal is in the range from 0.4 to 2° in the region of 80% or more of the total area of the wafer.

(3) The process for manufacturing the wafer of the silicon carbide single crystal according to (1) or (2), wherein the surface of the wafer cut from the silicon carbide single crystal is subjected to a surface treatment before epitaxial growth so that the surface does not contain damages by machining.

(4) The process for manufacturing the wafer of the silicon carbide single crystal according to any one of (1) to (3), wherein the feed ratio (C/Si) of the carbon source gas (C) to the silicon source gas (Si) is in the range from 0.5 to 1.4.

(5) The process for manufacturing a wafer of a silicon carbide single crystal according to any one of (1) to (4) by allowing the carbon source gas and silicon source gas to react at a temperature range from 1550 to 1700° C.

(6) The process for manufacturing the wafer of the silicon carbide single crystal according to anyone of (1) to (5), wherein the off-angle is increased from 0° in an approximately concentric manner from the center to the periphery of the wafer in order to restrict the area of the wafer with an off-angle of less than 0.4° to the region in the vicinity of the center of the wafer.

(7) The process for manufacturing the wafer of the silicon carbide single crystal according to any one of (1) to (6), wherein the off-angle is in the range from 0.4 to 1°.

(8) A wafer of a silicon carbide single crystal having a flat surface with a surface roughness of 2 nm or less over the entire surface of the wafer.

(9) The wafer of the silicon carbide single crystal according to (8) having a surface roughness of 1.5 nm or less.

(10) A wafer of a silicon carbide single crystal obtained by a manufacturing process having:

cutting a wafer from an α (hexagonal)-silicon carbide single crystal so that the off-angle is totally in the range from 0.4 to 2° to a plane obtained in perpendicular to the [0001]c axis of the silicon carbide single crystal;

disposing the wafer in a reaction vessel;

feeding a silicon source gas and carbon source gas in the reaction vessel; and epitaxially growing the α (hexagonal) silicon carbide single crystal on the wafer by allowing the silicon source gas and carbon source gas to react.

(11) The wafer of the silicon carbide single crystal according to (10), wherein the off-angle of the wafer cut from the silicon carbide single crystal is in the range from 0.4 to 2° in the region of 80% or more of the total area of the wafer.

(12) The wafer of the silicon carbide single crystal according to (10) or (11), wherein the surface of the wafer cut from the silicon carbide single crystal is subjected to a surface treatment before epitaxial growth so that the surface does not contain damages by machining.

(13) The wafer of the silicon carbide single crystal according to any one of (10) to (12), wherein the feed ratio (C/Si) of the carbon source gas (C) to the silicon source gas (Si) is in the range from 0.5 to 1.4.

(14) The wafer of the silicon carbide single crystal according to any one of (10) to (13), wherein the carbon source gas and silicon source gas are reacted at a temperature range from 1550 to 1700° C.

BEST MODE FOR CARRYING OUT THE INVENTION

The invention will be described below with reference to examples. However, the invention is by no means restricted to these examples.

Figure 1:
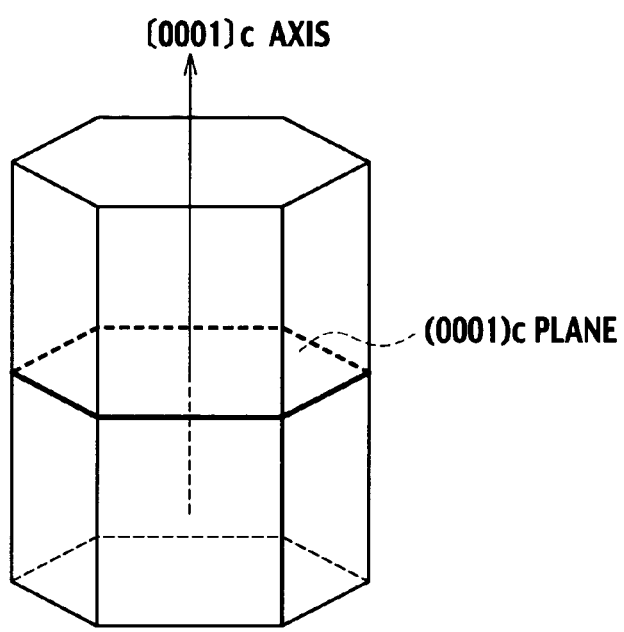
FIG. 1 is a schematic view showing the (0001) plane of the hexagonal silicon carbide single crystal.

The plane obtained perpendicular to the [0001]c axis of the silicon carbide single crystal as used in the specification refers to any one of the planes perpendicular to the [0001]c axis of the hexagonal silicon carbide single crystal as shown in FIG. 1. The off-angle refers to an inclined angle of an axis tilted from the (0001)c plane of the hexagonal silicon carbide single crystal.

An embodiment for manufacturing the silicon carbide single crystal will be described below.

(a) A bulk of an α (hexagonal)-silicon carbide single crystal is prepared at first.

Figure 7:
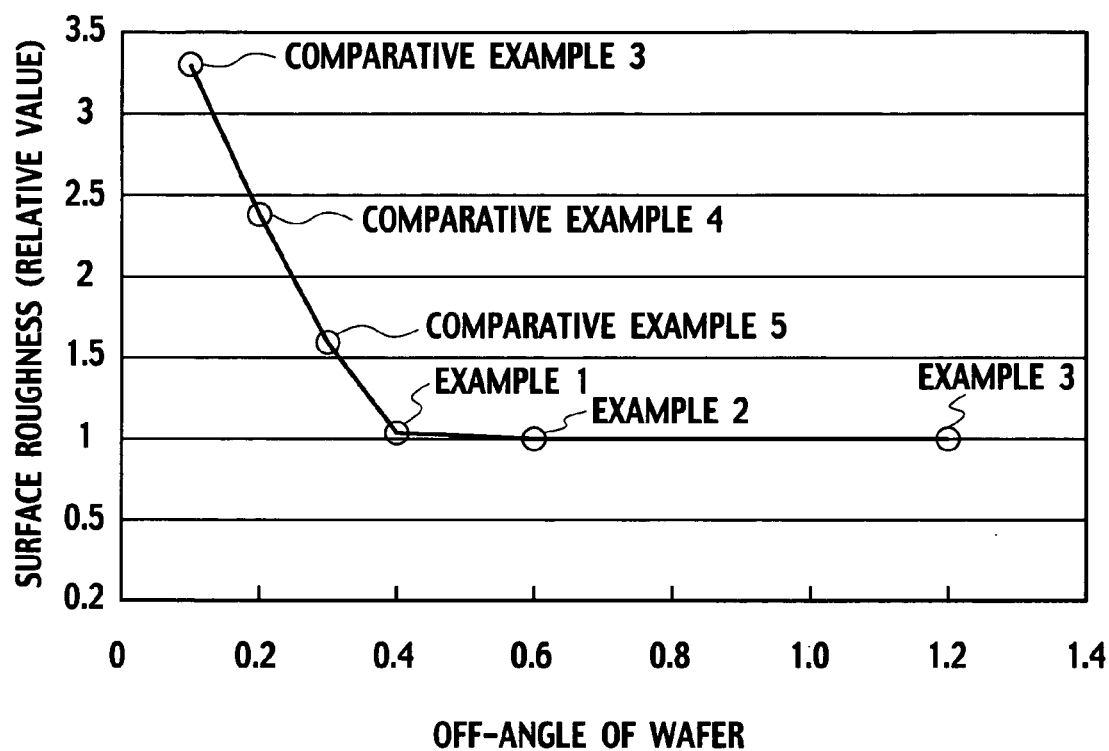
FIG. 7 shows the relation between the off-angle of the wafer and surface roughness (relative value) of the wafer according to Examples 1 to 3 and Comparative Examples 3 to 5.

(b) A wafer is cut at an off-angle of 0.4 to 2° relative to a plane perpendicular to the [0001]c axis of the silicon carbide single crystal from the prepared silicon carbide single crystal. The angle is determined because many concave and convex portions with a height of 1.5 nm appear on the epitaxial growth surface of silicon carbide as shown in FIG. 7 when the off-angle is less than 0.4°, and good elements are hardly manufactured. When the off-angle exceeds 2°, on the other hand, decrease of the utilization rate of the bulk crystal cannot be ignored. For example, when a wafer is manufactured with an off-angle of 3.5° that is common in the wafer of polymorph 6H from a bulk single crystal grown in the [0001]c axis direction and having a crystal diameter of 50 mm and crystal height of 20 mm, the utilization ratio of the bulk single crystal is 84%. However, the utilization rate is 91% when the off-angle is 2°. On the other hand, the utilization rate of the crystal can be increased to 98% when the off-angle is 0.4°. From the above-mentioned point of view, the off-angle is preferably from 0.4 to 1.2°, more preferably from 0.4 to 0.8°. Machining damages are removed from the surface of the wafer by applying surface treatment to the cut wafer in order to prevent defects derived from the defects of the substrate from generating. Examples of the surface treatment process include chemical mechanical polishing (CMP) and hydrogen etching.

(c) Then, the wafer is disposed in a chemical vapor deposition (CVD) apparatus. An example of the chemical vapor deposition process is a horizontal hot-wall CVD apparatus. High purity graphite is desirable as a constituting member of a susceptor for placing the wafer since the material has high heat resistance and is able to directly inductively heat the member with high frequency radiation. It is also favorable to coat the surface of the member with high purity silicon carbide or tantalum carbide in order to further reduce leakage of impurities such as metals and wear of the member at a high temperature.

(d) After heating the inside of the reaction vessel at a reaction temperature, a silicon source gas and a carbon source gas are supplied. While examples of the silicon source gas include monosilane, monochlorosilane, dichlorosilane and trichloroilane, monosilane is preferably used from the viewpoint of high reactivity and no generation of corrosive by-products. While examples of the carbon source gas include acetylene, ethylene, ethane and propane, propane gas is preferably used in terms of high efficiency as the carbon source. Hydrogen ($H_2$) is preferable as a carrier gas. The feed ratio (C/Si) of carbon (C) in the carbon source gas and silicon (Si) in the silicon source gas is preferably in the range from 0.5 to 1.4. Silicon is precipitated in the gas phase when the ratio C/Si is less than 0.5 to make it difficult to attain good epitaxial growth, while defects from slight crystal defects to visible macro-triangular pit defects are readily generated when the ratio exceeds 1.4. It is also possible to allow the crystal to grow at the above-mentioned C/Si ratio at the initial stage of growth, followed by succeeding growth under a condition having a different C/Si ratio from the above-mentioned ratio to form a different layer. It is favorable to etch the surface of the substrate at an intermediate stage of increasing or decreasing the temperature, or to introduce an appropriate gas in order to suppress etching. A gas containing an appropriate amount of impurities may be introduced during the growth for obtaining desired electric characteristics.

(e) The silicon carbide single crystal is epitaxially grown on the wafer by allowing the silicon source gas to react with the carbon source gas. For example, it is preferable to flow the hydrogen gas while the wafer is rotating, and to increase the temperature while the pressure is kept at 0 to 200 mbar. An appropriate amount of propane gas is introduced when the temperature has exceeded the range from 1300 to 1400° C. in order to suppress the substrate form being etched. Then, the temperature is increased to 1550 to 1700° C., and an appropriate amount of silane gas and propane gas with the above-mentioned C/Si ratio is introduced under an appropriate reduced pressure for the desired growth rate while the above-mentioned temperature is maintained. The crystal is epitaxially grown for a time necessary for obtaining a desired thickness. The growth rate of the epitaxial layer usually increases as the growth temperature increases and as the amounts of introduced silane gas and propane gas are increased, so long as the temperature is within a range of 1700° C. or lower. However, crystal defects tend to be generated when the growth rate is too high, and a mirror surface film can be hardly obtained. Accordingly, it is desirable for enhancing the manufacturing efficiency to select a condition under which the growth rate is as high as possible within a range not generating the defects.

To adjust the growth rate on the Si surface of 4H-polymorph is particularly effective for obtaining a flat epitaxial growth surface.

The silicon carbide single crystal is manufactured as described above. In the epitaxial growth of the silicon carbide single crystal using a substrate perpendicular to the [0001]c axis, epitaxial growth using the silicon surface is usually able to readily control the amount of impurities in wider range than epitaxial growth on the carbon surface. Consequently, the epitaxially grown film on the silicon surface can control electric characteristics in a wider range than the epitaxially grown film on the carbon surface. On the other hand, bunching of surface steps is usually liable to occur on the silicon surface than on the carbon surface. In other words, obtaining a flat epitaxial growth surface on the silicon surface is generally considered to be difficult than on the carbon surface. However, a quite flat epitaxial growth surface can be obtained either on the silicon surface or on the carbon surface by the manufacturing process according to the embodiment of the invention.

A quite flat epitaxial growth surface can be also obtained even when a wafer having a large aperture, for example a wafer of a silicon carbide single crystal with a diameter of 50 mm or more, is produced by the manufacturing process according to the embodiment of the invention. Thus, a wafer of a silicon carbide single crystal having a diameter of 50 mm or more can be provided. The wafer of the silicon carbide single crystal can be also manufactured by the same process as described above even when the α-silicon carbide single crystal is either 4H-polymorph or 6H-polymorph.

Modification of the Embodiment

It is desirable to cut a wafer from the silicon carbide single crystal so that the off-angle is as small as possible from the view point of improving the utilization rate of the bulk crystal and reducing propagation of defects of the substrate. When the off-angle is distributed in the surface of the wafer, the wafer is cut from the silicon carbide single crystal so that the off-angle is in the range from 0.4 to 2° in 80% or more of the total area of the wafer cut from the silicon carbide single crystal. Specifically, it is favorable to increase the off-angle from 0° from the center to the periphery of the wafer in an approximately concentric manner in order to restrict the region with an off-angle of less than 0.4° to a narrow range around the center of the wafer (a region with an area of 20% or less of the total area), when a constant off-angle is difficult to obtain over the entire surface of the wafer.

It is also favorable to increase the off-angle from 0° from an end portion to the center of the wafer in an approximately concentric manner in order to restrict the region having an off-angle of less than 0.4° to a narrow range around the end portion of the wafer (a region with an area of 20% or less of the total area). A quite flat epitaxial growth surface without any macroscopic convex and concave portions can be always obtained over the entire surface of the wafer irrespective of the off-angle usually found in the surface of the wafer and distribution of the off-direction, by adjusting the off-angle to be 0.4° or more over the substantially entire surface of the wafer according to the process of the invention.

(Wafer of Silicon Carbide Single Crystal)

The wafer of the silicon carbide single crystal is manufactured by the process for manufacturing the silicon carbide single crystal according to the above-mentioned embodiment. Surface defects such as macroscopic triangular pits are not found at all by an observation of the surface of the wafer of the silicon carbide single crystal under a Nomarski differential-interference optical microscope despite of quite small off-angles. The surface of the wafer of the silicon carbide single crystal is quite flat in an area with the off-angle of 0.4° or more without any concave and convex portions with a height of exceeding 2 nm according to the observation of the surface with an atomic force microscope. No linear or spot-like macroscopic concave and convex portions with a length of μm-order that are generated when the off-angle is less than 0.4° are not observed at all either. In addition, the number of surface dislocations originating from the substrate is quite as small as 10 dislocations/cm². Accordingly, a high quality element can be manufactured. The surface roughness is usually estimated to be small by being averaged when the detection region or measuring spot diameter is large as in the optical measurement. On the contrary, the maximum surface roughness (maximum height: Ry) is usually reduced when the measuring region is small. Accordingly, the "surface roughness" is defined to be Ry determined in a measuring region of at least 1 μm square by AFM, the surface with sufficiently small Ry and without any macroscopic concave and convex portions is defined as a flat surface in the specification of the invention.

The electronic device using the wafer of the silicon carbide single crystal is expected to be a metal oxide semiconductor (MOS) field effect transistor. A gate oxidation film (insulation film) of an MOS structure is usually formed on the surface of the epitaxially grown film by thermal oxidation of the epitaxially grown film. Accordingly, it is preferable that the surface of the epitaxially grown film before oxidation is sufficiently flat as compared with the order of the thickness of the oxidation film in order to form an oxidation film with a uniform thickness and uniform pressure resistance. Since the gate oxidation film usually has a thickness in the range from 20 to 60 nm, the surface roughness of the epitaxially grown film is required to be in the range from about 2 nm to about 6 nm assuming that the acceptable range of variation of the thickness of the oxidation film is 10%. However, the surface roughness of the silicon carbide single crystal according to the invention never exceeds 2 nm as described above. Therefore, the silicon carbide single crystal according to the invention may be favorably used for electronic devices, particularly for manufacturing the MOS field effect transistors.

(Applications)

The wafer of the silicon carbide single crystal according to the invention is of quite high quality without immigration of macroscopic triangular pits and polymorphs, with a flat surface and with fewer surface dislocations on the substrate. Accordingly, the wafer may be favorably used for electronic devices, particularly power devices and luminescent diode, being excellent in high voltage resistance, dielectric breakdown strength, heat resistance and radiation resistance.

EXAMPLES

While the invention is described in detail with reference to examples and comparative examples, the invention is by no means restricted to these examples.

Example 1

Silicon Surface

Wafer: A wafer of 6H polymorph (diameter: 50.8 mm) with an off-angle of 0.4° was prepared, and the silicon surface of the wafer prepared was etched by heating at 1400° C. in hydrogen for 30 minutes after mirror-polishing of the silicon surface of the wafer.

Growth condition: The wafer was disposed in a horizontal hot-wall CVD apparatus having a susceptor made of graphite coated with tantalum carbide and having a cross section of the gas flow passageway with a cross section 3 cm in the height and 17 cm in the width. Hydrogen was fed at a flow rate of 70 slm while the wafer is rotating, and the temperature was raised while the pressure is maintained at 120 mbar. Propane gas was introduced at a rate of 8 sccm when the temperature has exceeded 1400° C. The temperature was further raised to 1650° C., and the crystal was epitaxially grown for 1.5 hours by introducing monosilane gas at a rate of 20 sccm while the temperature was maintained at 1650° C. The feed ratio (C/Si) of the material gas was 1.2.

Figure 2:
FIG. 2 shows a differential interference microscope image of the surface of the wafer of the silicon carbide single crystal according to Example 1.
Figure 3:
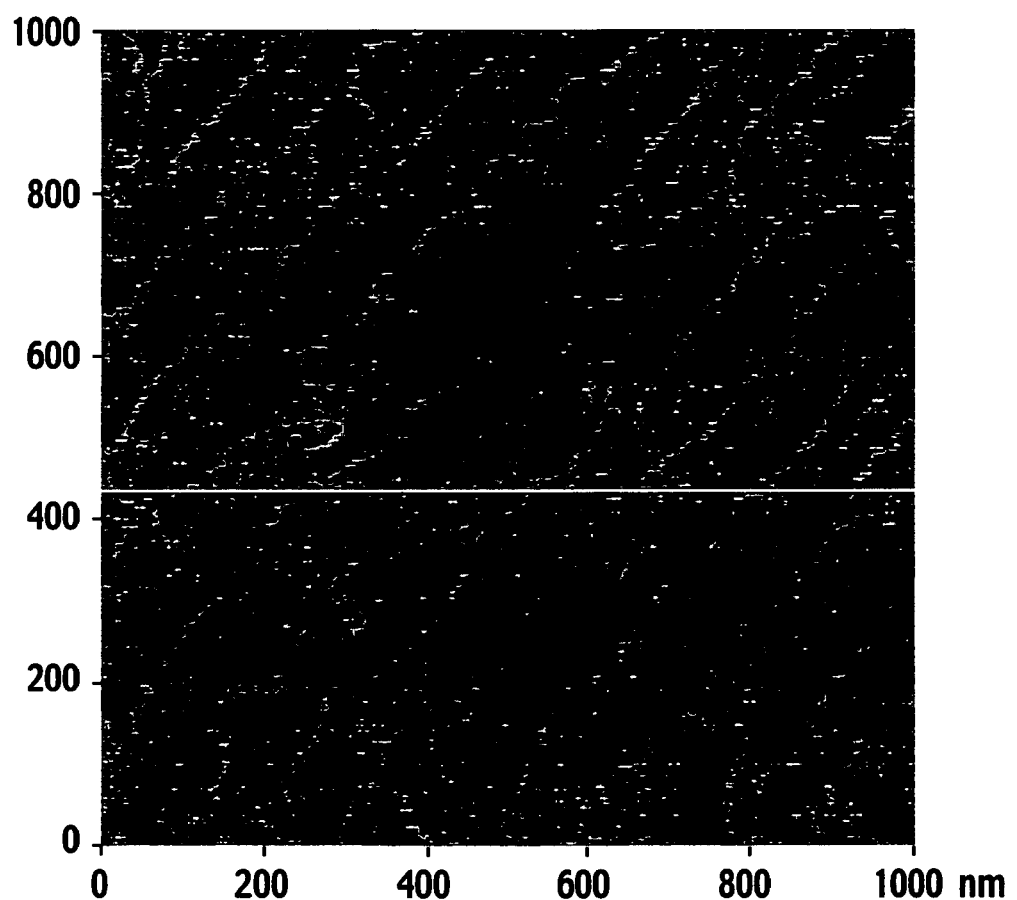
FIG. 3 shows anatomic force microscope image of the surface of 1 μm square of the wafer of the silicon carbide single crystal according to Example 1.
Figure 4:
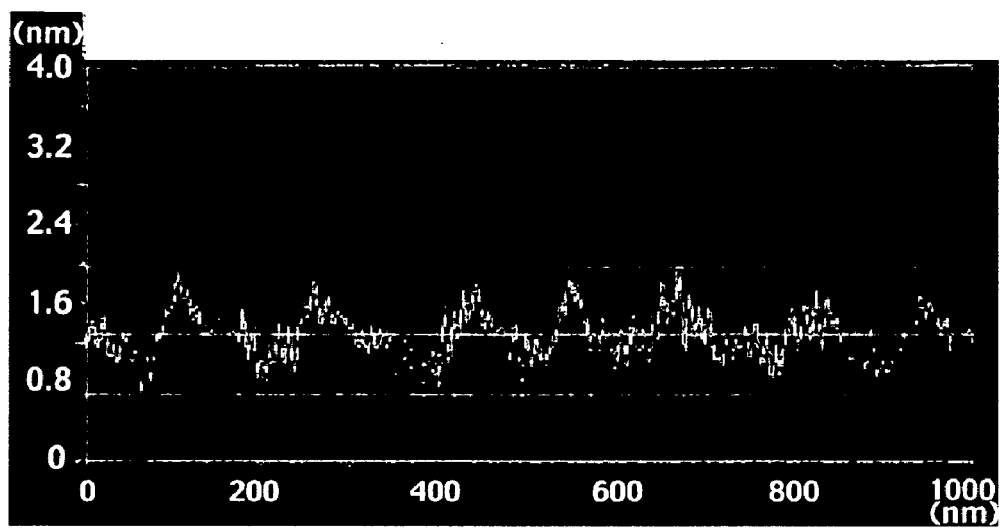
FIG. 4 shows a roughness curve along the white line in FIG. 3.
Figure 5:
FIG. 5 shows a differential interference microscope image of the surface of the wafer of the silicon carbide single crystal according to Comparative Example 1.
Figure 5:
Figure 6:
FIG. 6 shows a differential interference microscope image of the surface of the wafer of the silicon carbide single crystal according to Comparative Example 2.
Figure 6:

Results: As shown in FIG. 2, a mirror surface film without any defects such as macroscopic triangular pits on the entire surface of the wafer was obtained. No regions showing linear or spot-like concave and convex portions were not observed at all from the center to the periphery of the wafer by observation with a Nomarski (differential-interference) optical microscope that is able to readily observe and recognize concave and convex portions with a height of 2 nm or more and a width of 2 μm or more, and the wafer was confirmed to be flat. The thickness of the epitaxial layer was 7.2 μm. The results of measurement of the surface roughness with an atomic force microscope showed that the maximum height (Ry) of the concave and convex portions was 1.165 nm in a 1 μm square area as shown in FIG. 3. The surface roughness curve along the white line in FIG. 3 was as shown in FIG. 4.

Comparative Example 1

Silicon Surface

Wafer: A wafer of 6H polymorph (diameter: 50.8 mm) with an off-angle of 0.2° was prepared, and the silicon surface of the wafer prepared was etched by heating at 1400° C. in hydrogen for 30 minutes after mirror-polishing of the silicon surface of the wafer.

Growth condition: The growth condition was the same as in Example 1.

Results: While the thickness of the layer was 6.8 μm, many linear undulations with a height in the range from 5 nm to 10 nm were generated approximately in parallel to one another with a distance of about 20 μm.

Comparative Example 2

Silicon Surface

A wafer of 6H polymorph (diameter: 50.8 mm) with an off-angle of 0.04° was prepared, and the silicon surface of the wafer prepared was polished by CMP polishing for 8 hours using silica colloid after mirror-polishing of the silicon surface of the wafer.

Growth condition: The growth condition was the same as in Example 1.

Results: While the thickness of the layer was 7.2 μm, many spots of protuberances with a height of about 20 nm were generated over the entire surface of the wafer.

Examples 2 and 3, and Comparative Examples 3, 4 and 5

Silicon Surface

Experiments: The experiments were performed by the same process as in Example 1, except that wafers of 6H polymorph (diameter: 50.8 mm) with off-angles of 0.1° (Comparative Example 3), 0.2° (Comparative Example 4), 0.3° (Comparative Example 5), 0.6° (Example 2) and 1.2°

(Example 3) were prepared. The surface roughness of the epitaxial film was measured in regions of 20 μm square, and the maximum height of concave and convex portions (Ry) was determined using an atomic force microscope.

Results: The relation between the off-angle of the wafer and surface roughness (relative value) is shown in FIG. 7. It was shown that a silicon carbide single crystal having a quite flat surface could be obtained by setting the off-angle at 0.4° or more.

Example 4

Silicon Surface

Wafer: A wafer of 6H polymorph (diameter: 50.8 mm) with an off-angle of 0.4° was prepared, and the silicon surface of the wafer prepared was polished by CMP polishing for 8 hours using silica colloid after mirror-polishing of the silicon surface of the wafer.

Growth condition: The growth condition was the same as in Example 1.

Results: A mirror surface film without any defects such as macroscopic triangular pits on the entire surface of the wafer was obtained. The thickness of the epitaxially grown layer was 7.1 μm.

Example 5

Carbon Surface

Wafer: A wafer of 6H polymorph (diameter: 50.8 mm) with an off-angle of 0.4° was prepared and, after mirror polishing of the carbon surface of the wafer, an oxide film formed on the surface by heating the wafer at 1100° C. for 5 hours was removed by treating with hydrofluoric acid. The wafer was used after polishing the surface by CMP for 8 hours using silica colloid.

Growth condition: The carbon layer was epitaxially grown under the same condition as in Example 1.

Figure 8:
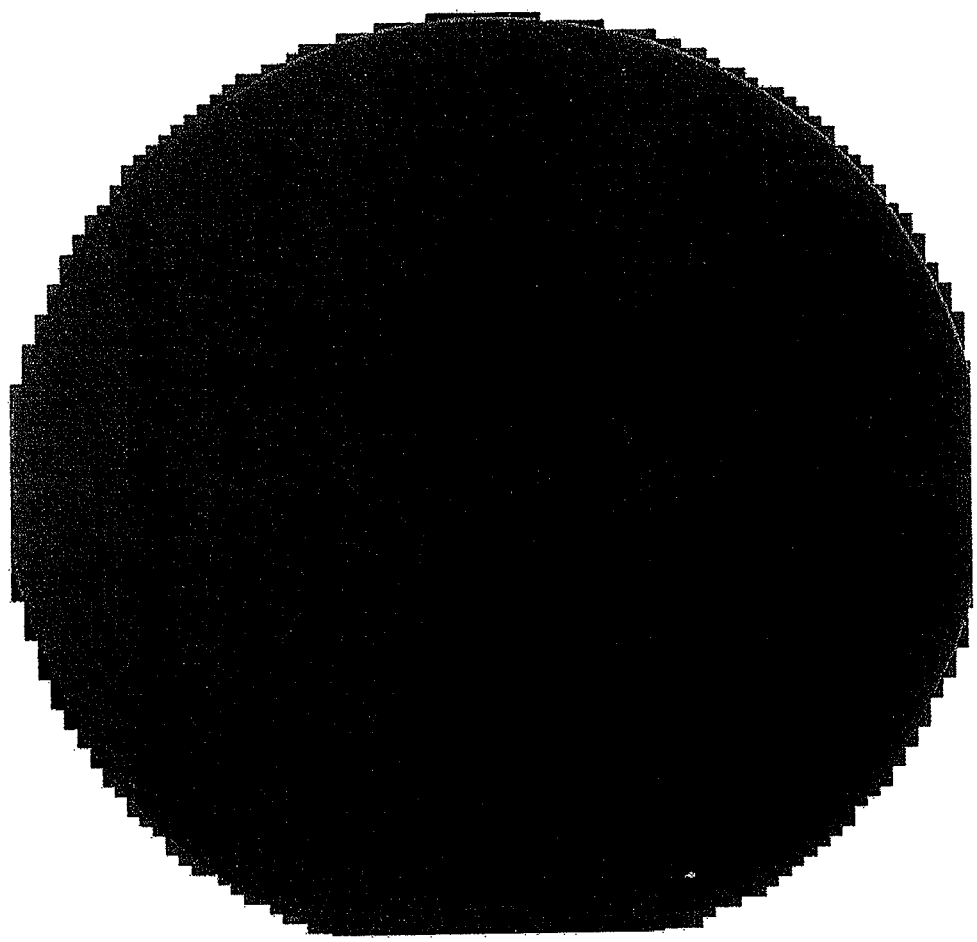
FIG. 8 shows a differential interference microscope image of the surface of the wafer of the silicon carbide single crystal according to Example 5.
Figure 9:
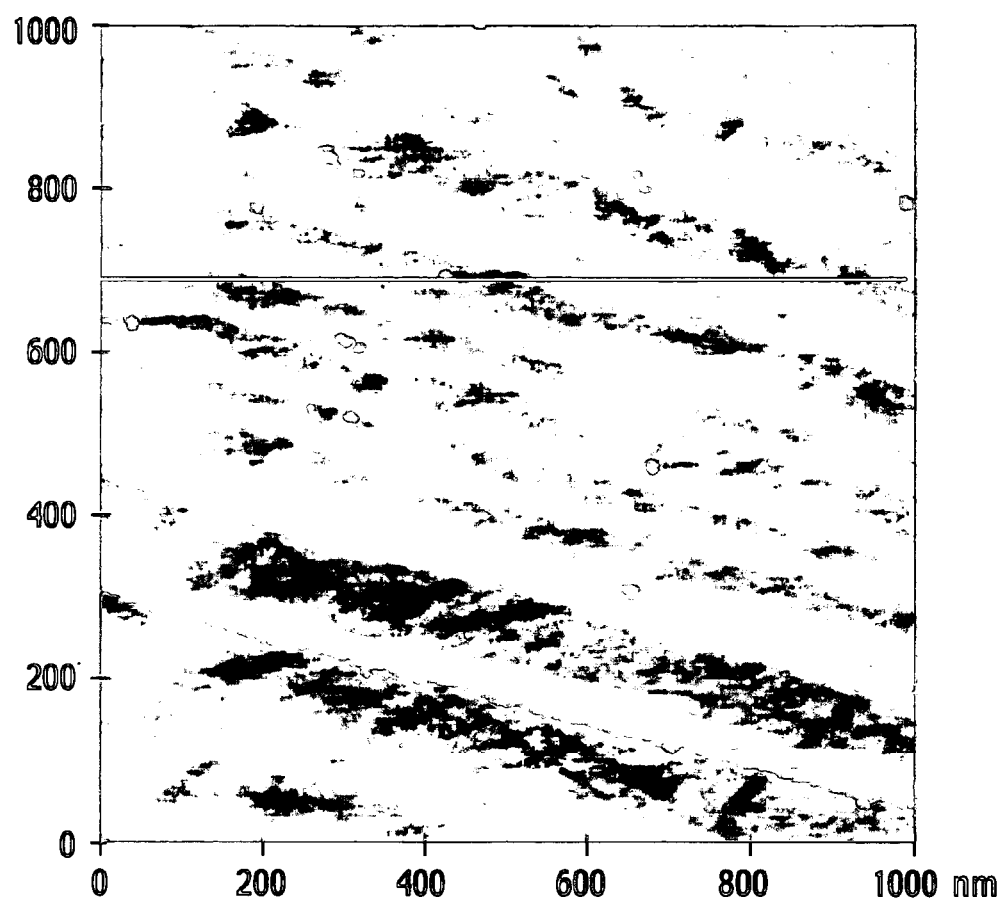
FIG. 9 shows anatomic force microscope image of the surface of 1 μm square of the wafer of the silicon carbide single crystal according to Example 5.
Figure 10:
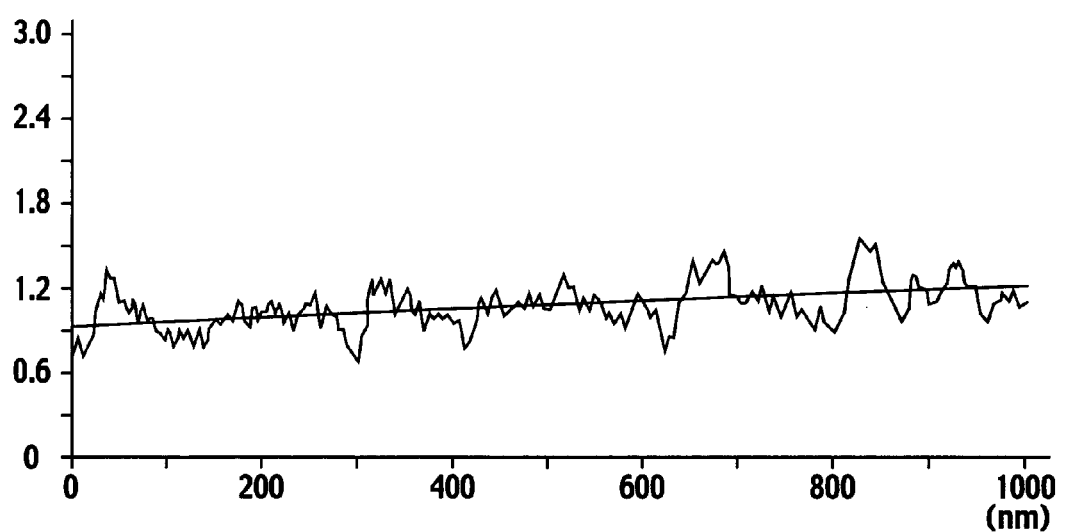
FIG. 10 shows a roughness curve along the white line in FIG. 9.

Results: A mirror surface film without any macroscopic triangular pits on the entire surface was obtained as shown in FIG. 8. The thickness of the epitaxially grown layer was 3.7 μm. The maximum height (Ry) of the concave and convex portions was 0.748 nm in a 1 μm square area as shown in FIG. 9 from the results of measurements of the surface roughness with an atomic force microscope. The surface roughness curve along the white line in FIG. 9 was as shown in FIG. 10. It was also confirmed that a tendency resembling to the results shown in FIG. 7 was obtained when the layer was epitaxially grown by preparing a plurality of wafers having various off-angles as in the silicon surface.

Comparative Example 6

Silicon Surface

Wafer: The same wafer as used in Example 4 was used, except that the wafer was not polished by CMP.

Growth condition: The growth condition was the same as in Example 1.

Figure 11:
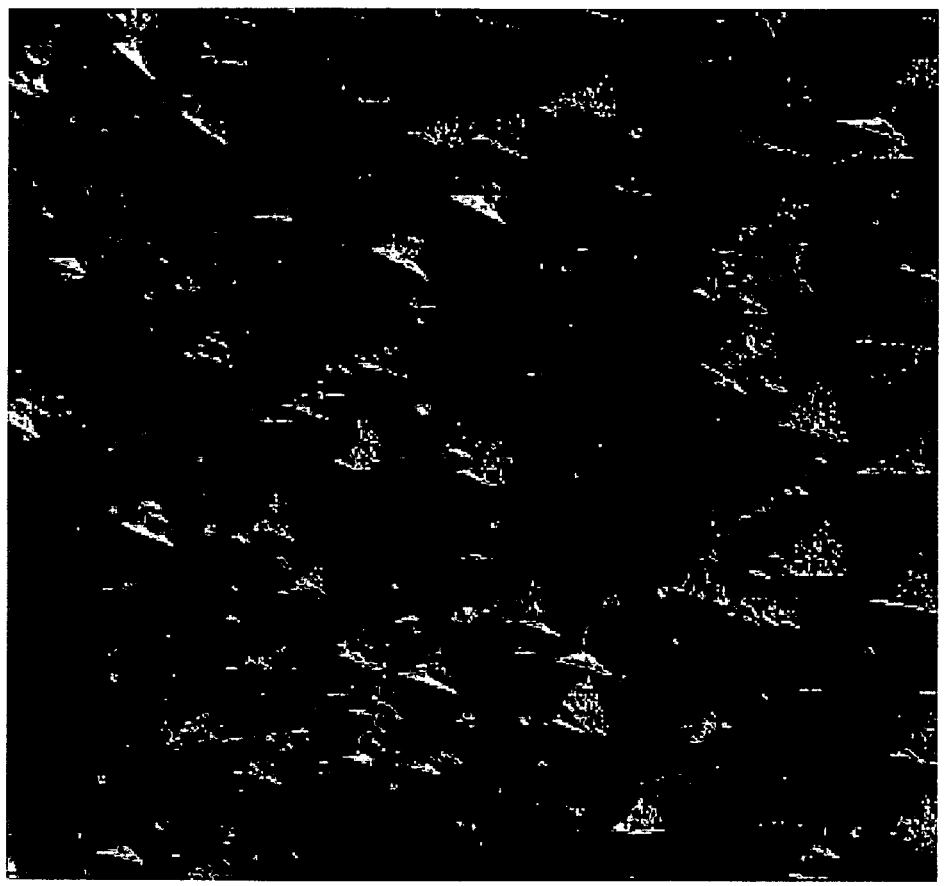
FIG. 11 shows a differential interference microscope image of the surface of the wafer of the silicon carbide single crystal according to Comparative Example 6.

Results: Many defects of triangular pits with a length of about 1 mm on each side and a depth of 1 μm appeared on the entire surface of the wafer as shown in FIG. 11.

Examples 6 and 7

Silicon Surface

The wafer was grown by the same process as in Example 1, except that the gas feed ratios (C/Si) were 0.8 (Comparative Example 6) and 1.4 (Comparative Example 7).

The same effect as in Example was obtained, and the surface was flat with a surface roughness not exceeding 2 nm by an observation under an atomic force microscope.

Example 8

Silicon Surface

A wafer of 4H polymorph (diameter: 50.8 mm) with an off-angle of 0.4° was prepared, and the silicon surface of the wafer prepared was etched by heating at 1300° C. in hydrogen for 60 minutes after mirror-polishing of the silicon surface of the wafer.

Growth condition: The wafer was disposed in a hot wall CVD apparatus as in Example 1, and the temperature was raised while hydrogen is supplied at a rate of 70 slm and the wafer was rotating with the pressure maintained at 120 mbar. Propane gas was introduced at a rate of 8 sccm when the temperature had exceeded 1400° C. The temperature was raised to 1650° C., and the wafer was further subjected to epitaxial growth for 1.5 hours by introducing monosilane gas and propane gas at the rates of 34 sccm and 8 sccm, respectively, while the temperature was maintained at 1650° C. The feed ratio (C/Si) of the material gas was 0.7. The temperature was decreased thereafter under the same pressure and atmosphere as those when the temperature was increased.

Figure 12:
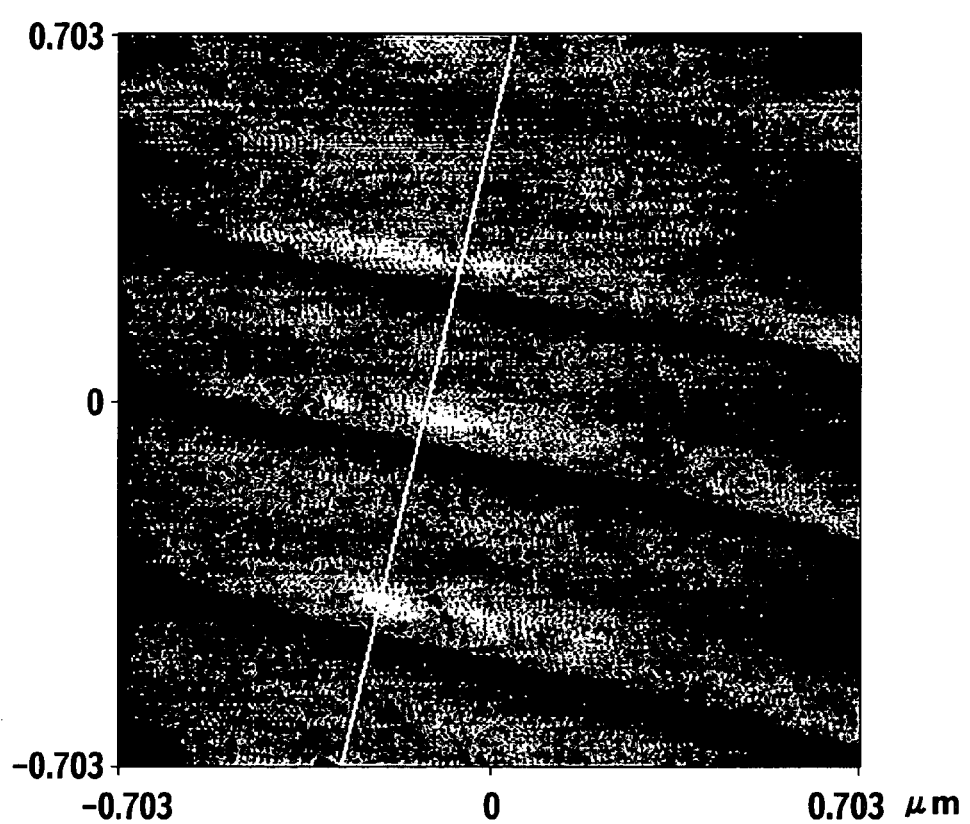
FIG. 12 shows an atomic force microscope image of the surface of 1.4 μm square of the wafer of the silicon carbide single crystal according to Example 8.
Figure 13:
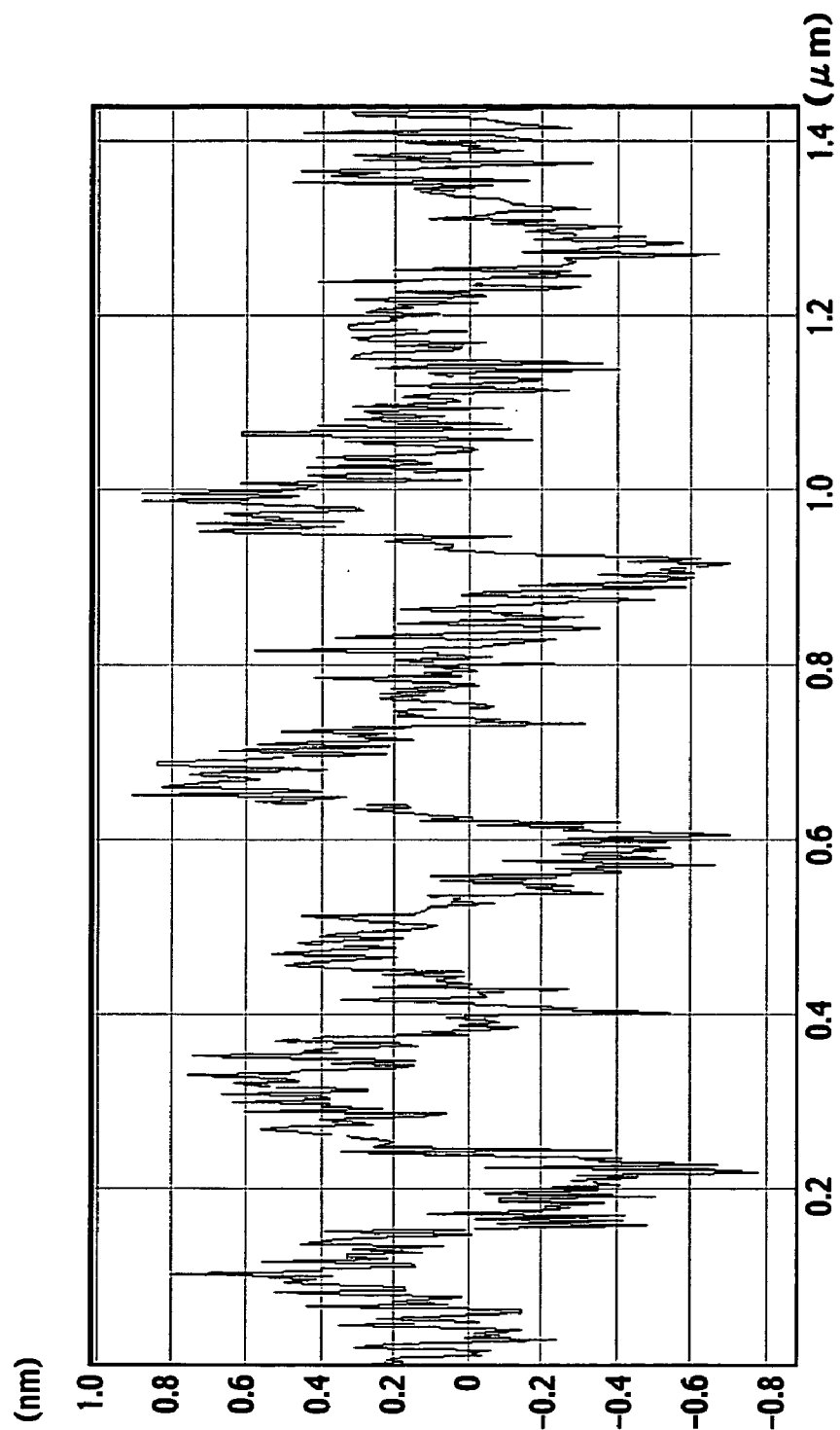
FIG. 13 shows a surface roughness curve along the white line in FIG. 12.

Results: A mirror surface film without any defects such as microscopic triangular pits on the entire surface of the wafer was obtained. The thickness of the epitaxially grown layer was 3.8 μm. Regions showing linear or spot-like, macroscopic concave and convex portions with a length exceeding μm order were not observed at all by observation with a Nomarski (differential-interference) optical microscope from the center through the periphery of the wafer as in Example 1. The surface roughness of the epitaxially grown film obtained was measured with am atomic force microscope, and the result showed that the maximum height (Ry) of the convex and concave portion was 1.85 nm in a 1.4 μm square area. The roughness curve on the white line in FIG. 12 was as shown in FIG. 13.

Comparative Example 7

Silicon Surface

Wafer: A wafer of 4H polymorph (diameter: 50.8 mm) with an off-angle of 0.3° was prepared and, after mirror polish of the silicon surface of the wafer obtained, the surface of the wafer was etched in hydrogen at 1300° C. for 60 minutes with heating.

Growth condition: The growth condition was the same as in Example 8.

Figure 14:
FIG. 14 shows a differential interference microscope image of the surface of the wafer of the silicon carbide single crystal according to Comparative Example 7.

Results: While the thickness of the wafer was 3.7 μm, many linear undulations with a height of 10 nm to 20 nm were generated approximately in parallel to one another over the entire surface of the wafer with a distance from 100 to 200 μm as shown in FIG. 14.

Example 9

Carbon Surface

Wafer: A wafer of 4H polymorph (diameter: 50.8 mm) with an off-angle of 0.4° was prepared and, after mirror polishing of the carbon surface of the wafer, an oxide film formed on the surface by heating the wafer at 1100° C. for 5 hours was removed by treating with hydrofluoric acid. The wafer was polished with CMP for 8 hours using silica colloid after etching the surface in hydrogen at 1400° C. for 30 minutes.

Growth condition: The wafer was epitaxially grown under the same condition as in Example 1.

Figure 15:
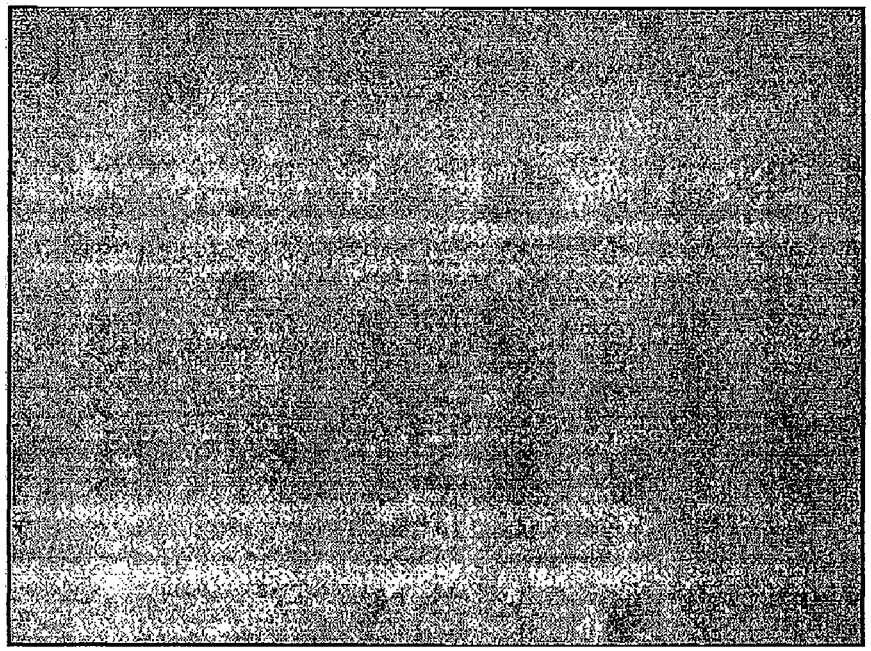
FIG. 15 shows a differential interference microscope image of the surface of the wafer of the silicon carbide single crystal according to Example 9.
Figure 16:
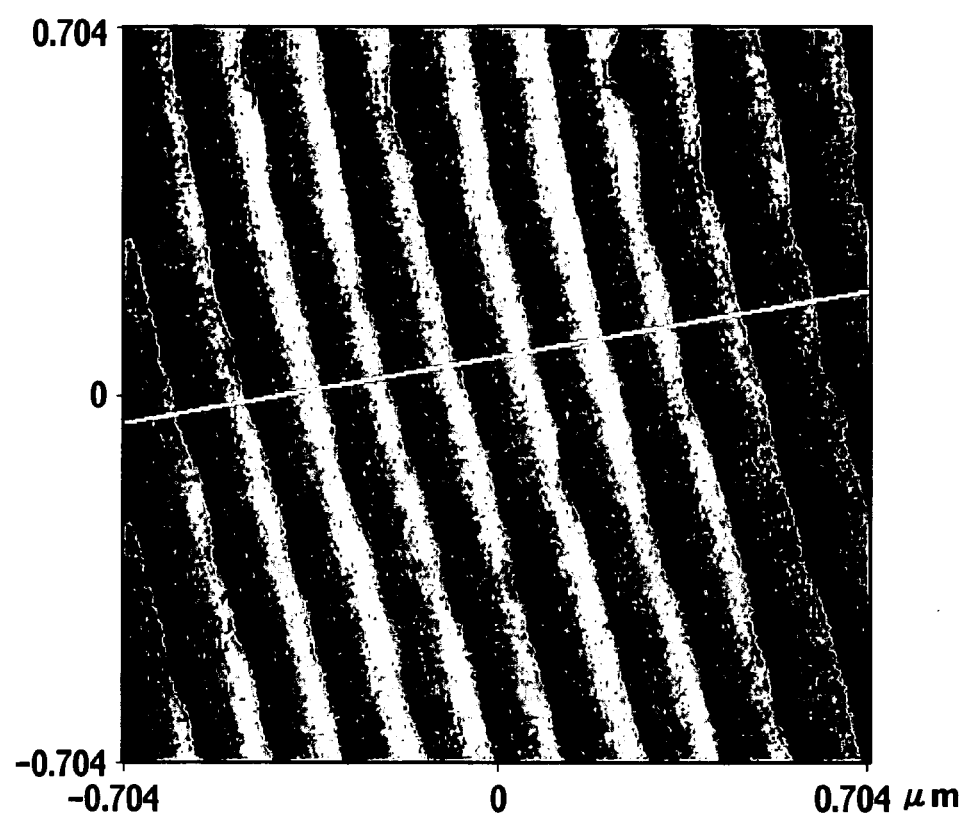
FIG. 16 shows an atomic force microscope image of the surface of 1.4 μm square of the wafer of the silicon carbide single crystal according to Example 9.
Figure 17:
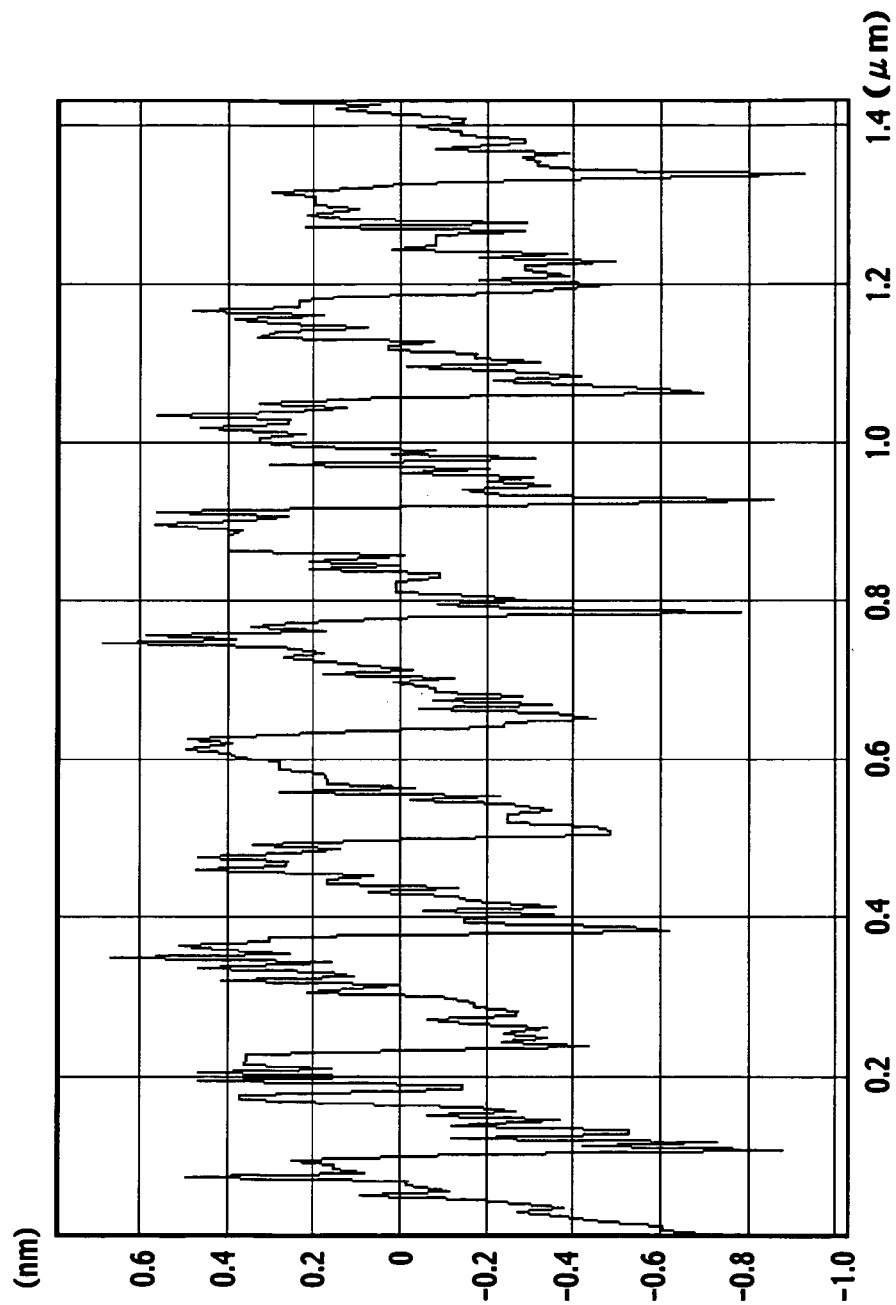
FIG. 17 shows a surface roughness curve along the white line in FIG. 16.

Results: A mirror surface film without no defects such as macroscopic triangular pits on the entire surface was obtained. The thickness of the epitaxially grown layer was 2.8 µm. Regions showing liner or spot-like, macroscopic concave and convex portions with a length of exceeding µm order as shown in FIG. 15 were not observed at all from the center through the periphery of the wafer as in Example 1. The maximum height (Ry) of the concave and convex portions was 1.63 nm in the range of 1.4 µm square as shown in FIG. 16, from the results of measurement of the surface roughness of the epitaxially grown film with anatomic force microscope. The surface roughness curve along the white line in FIG. 16 was as shown in FIG. 17.

Comparative Example 8

Carbon Surface

Wafer: A wafer of 4H polymorph (diameter: 50.8 mm) with an off-angle of 0.3° was prepared and, after mirror polishing of the carbon surface of the wafer prepared, an oxide film formed on the surface by heating the wafer at 1100° C. for 5 hours was removed by treating with hydrofluoric acid. The wafer was polished with CMP for 8 hours using silica colloid after etching the surface in hydrogen at 1400° C. for 30 minutes.

Growth condition: The growth condition was the same as in Example 9.

Figure 18:
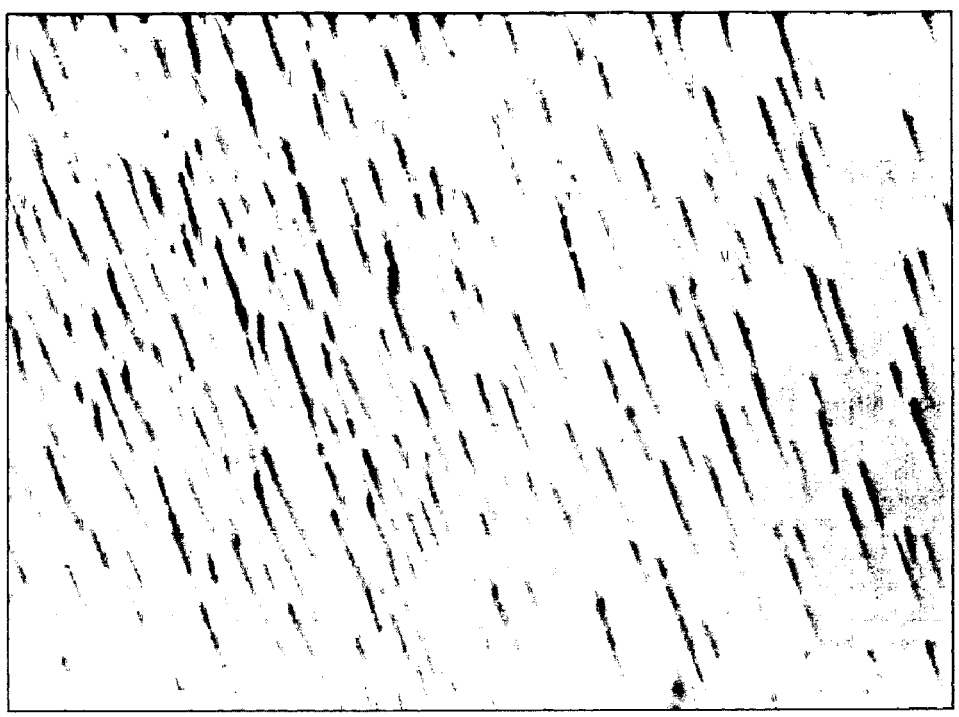
FIG. 18 shows a differential interference microscope image of the surface of the wafer of the silicon carbide single crystal according to Comparative Example 8.

Results: While the thickness of the wafer was 3.0 µm, many linear undulations with a height of 5 nm to 10 nm were generated approximately in parallel to one another over the entire surface of the wafer with a distance from 20 to 100 µm as shown in FIG. 18.

The application of this invention pertains claim of priority based on the prior Japanese patent applications filed by the present applicant, or Japanese Patent Application Nos. 2004-158113 (application date: May 27, 2004) and 2004-338058 (application date: Nov. 22, 2004), and these specifications are incorporated herein by reference.

INDUSTRIAL APPLICABILITY

The invention provides a process for manufacturing the wafer of the silicon carbide single crystal capable of improving the utilization ratio of the bulk silicon carbide single crystal, capable of improving characteristics of the element and capable of improving cleavability, and the wafer of the silicon carbide single crystal obtained by the manufacturing process.

The invention claimed is:

1. A process for manufacturing a wafer of a silicon carbide single crystal comprising:
    cutting a wafer from an α (hexagonal)-silicon carbide single crystal so that the off-angle is totally in the range from 0.4 to 2° to a plane obtained in perpendicular to the [0001]c axis of the silicon carbide single crystal;
    disposing the wafer in a reaction vessel;
    feeding a silicon source gas and carbon source gas in the reaction vessel; and
    epitaxially growing the α (hexagonal) silicon carbide single crystal on the wafer by allowing the silicon source gas and carbon source gas to react at a temperature range from 1550 to 1700° C.,
    wherein the feed ratio (C/Si) of the carbon source gas (C) to the silicon source gas (Si) is in the range from 0.5 to 1.4,
    wherein the off-angle is increased from 0° in an approximately concentric manner from the center to the periphery of the wafer in order to restrict the area of the wafer with an off-angle of less than 0.4° to the region in the vicinity of the center of the wafer.

2. The process for manufacturing the wafer of the silicon carbide single crystal according to claim 1, wherein the off-angle is in the range from 0.4 to 1°.

3. The process for manufacturing the wafer of a silicon carbide single crystal according to claim 1 for obtaining a flat surface with a surface roughness (Ry) of 2 nm or less over the entire surface of the wafer.

4. The process for manufacturing the wafer of a silicon carbide single crystal according to claim 3, wherein the surface roughness (Ry) is 1.5 nm or less.

5. The process for manufacturing the wafer of a silicon carbide single crystal according to claim 1, wherein the off-angle is in the range from 0.4 to 0.6°.

* * * * *